(12) United States Patent
Liu et al.

(10) Patent No.: US 11,362,087 B2
(45) Date of Patent: Jun. 14, 2022

(54) SYSTEMS AND METHODS FOR FABRICATING FINFETS WITH DIFFERENT THRESHOLD VOLTAGES

(71) Applicant: TAIWAN SEMICONDUCTOR MANUFACTURING CO., LTD., Hsinchu (TW)

(72) Inventors: Chi-Wen Liu, Hsinchu (TW); Chao-Hsiung Wang, Hsin-Chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/049,248

(22) Filed: Jul. 30, 2018

(65) Prior Publication Data

US 2018/0350807 A1    Dec. 6, 2018

Related U.S. Application Data

(62) Division of application No. 14/151,350, filed on Jan. 9, 2014, now Pat. No. 10,037,991.

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 21/84* (2013.01); *H01L 27/1207* (2013.01); *H01L 27/1211* (2013.01)

(58) Field of Classification Search
CPC .................................................. H01L 27/0886
(Continued)

(56) References Cited

U.S. PATENT DOCUMENTS 8,497,171 B1 * 7/2013 Wu ................. H01L 21/823821
438/218
8,901,607 B2   12/2014 Wang et al.
(Continued)

FOREIGN PATENT DOCUMENTS

CN    103928515 A    7/2014
CN    103928517 A    7/2014
(Continued)

OTHER PUBLICATIONS

Office Action dated Jun. 1, 2017 issued in German Patent Application No. 10-2014-119340.7 (8 pages).
(Continued)

*Primary Examiner* — Hsin Yi Hsieh
(74) *Attorney, Agent, or Firm* — McDermott Will & Emery LLP

(57) ABSTRACT

Systems and methods are provided for fabricating semiconductor device structures on a substrate. A first fin structure is formed on a substrate. A second fin structure is formed on the substrate. A first semiconductor material is formed on both the first fin structure and the second fin structure. A second semiconductor material is formed on the first semiconductor material on both the first fin structure and the second fin structure. The first semiconductor material on the first fin structure is oxidized to form a first oxide. The second semiconductor material on the first fin structure is removed. A first dielectric material and a first electrode are formed on the first fin structure. A second dielectric material and a second electrode are formed on the second fin structure.

20 Claims, 20 Drawing Sheets

(51) Int. Cl.
*H01L 21/84* (2006.01)
*H01L 27/12* (2006.01)

(58) Field of Classification Search
USPC .......................................................... 257/391
See application file for complete search history.

(56) References Cited

U.S. PATENT DOCUMENTS

| | | | |
|---|---|---|---|
| 2007/0170474 A1* | 7/2007 | Kawasaki | ....... H01L 21/823412 |
| | | | 257/288 |
| 2007/0278576 A1 | 12/2007 | Kim et al. | |
| 2009/0008705 A1 | 1/2009 | Zhu et al. | |
| 2009/0278196 A1 | 11/2009 | Chang et al. | |
| 2010/0163971 A1 | 7/2010 | Hung et al. | |
| 2013/0075797 A1 | 3/2013 | Okano | |
| 2013/0161756 A1 | 6/2013 | Glass et al. | |
| 2013/0320455 A1 | 12/2013 | Cappellani et al. | |
| 2014/0197456 A1 | 7/2014 | Wang et al. | |
| 2014/0197457 A1 | 7/2014 | Wang et al. | |
| 2015/0021699 A1 | 1/2015 | Ando et al. | |
| 2015/0108544 A1 | 4/2015 | Ching et al. | |
| 2015/0132901 A1 | 5/2015 | Wang et al. | |
| 2015/0325665 A1* | 11/2015 | Masuoka | ............ H01L 29/1037 |
| | | | 257/329 |
| 2015/0340290 A1* | 11/2015 | Zhu | .................... H01L 29/1029 |
| | | | 257/401 |
| 2016/0005656 A1 | 1/2016 | Ching et al. | |

FOREIGN PATENT DOCUMENTS

| | | |
|---|---|---|
| KR | 20150044804 A | 4/2015 |
| TW | 335067 B | 12/2010 |
| TW | 370546 B | 8/2012 |
| TW | I383498 B | 1/2013 |

OTHER PUBLICATIONS

Office Action dated Apr. 6, 2017 issued in Chinese Patent Applicaion 201410383797.8 (8 pages).
Office Action dated Jan. 19, 2017 issued in Taiwan Patent Application 103146010 (4 pages).
Notice of Allowance dated Oct. 5, 2016 issued in Korean Patent Application No. 10-2014-0186094 (6 pages).
Notice of Allowance dated Mar. 28, 2018 issued in U.S. Appl. No. 14/151,350 (11 pages).
Final Office Action dated Dec. 14, 2017 issued in U.S. Appl. No. 14/151,350 (9 pages).
Non-Final Office Action dated May 17, 2017 issued in U.S. Appl. No. 14/151,350 (13 pages).
Final Office Action dated Nov. 29, 2016 issued in U.S. Appl. No. 14/151,350 (17 pages).
Non-Final Office Action dated May 24, 2016 issued in U.S. Appl. No. 14/151,350 (15 pages).
Final Office Action dated Feb. 24, 2016 issued in U.S. Appl. No. 14/151,350 (13 pages).
Non-Final Office Action dated Aug. 20, 2015 issued in U.S. Appl. No. 14/151,350 (13 pages).
Non-Final Office Action dated Aug. 15, 2015 issued in U.S. Appl. No. 14/151,350 (9 pages).

* cited by examiner

SYSTEMS AND METHODS FOR FABRICATING FINFETS WITH DIFFERENT THRESHOLD VOLTAGES

RELATED APPLICATION

This application is a Divisional Application of U.S. patent application Ser. No. 14/151,350 filed on Jan. 9, 2014, the entire contents of which are incorporated herein by reference.

FIELD

The technology described in this disclosure relates generally to semiconductor devices and more particularly to fabrication of semiconductor devices.

BACKGROUND

A FinFET is a field effect transistor that often includes an active region of a semiconductor material protruding from a substrate, resembling a fin. The fin usually includes a source region and a drain region, with areas of the fin separated by shallow trench isolation (STI). A FinFET also includes a gate region located between the source region and the drain region. The gate region is usually formed on a top surface and side surfaces of the fin so as to wrap around the fin. A channel region within the fin often extends under the gate region between the source region and the drain region. Compared to planar devices, FinFETs usually have better short channel effects (SCE) to enable continuous scaling, and have larger channel widths to yield higher driving currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
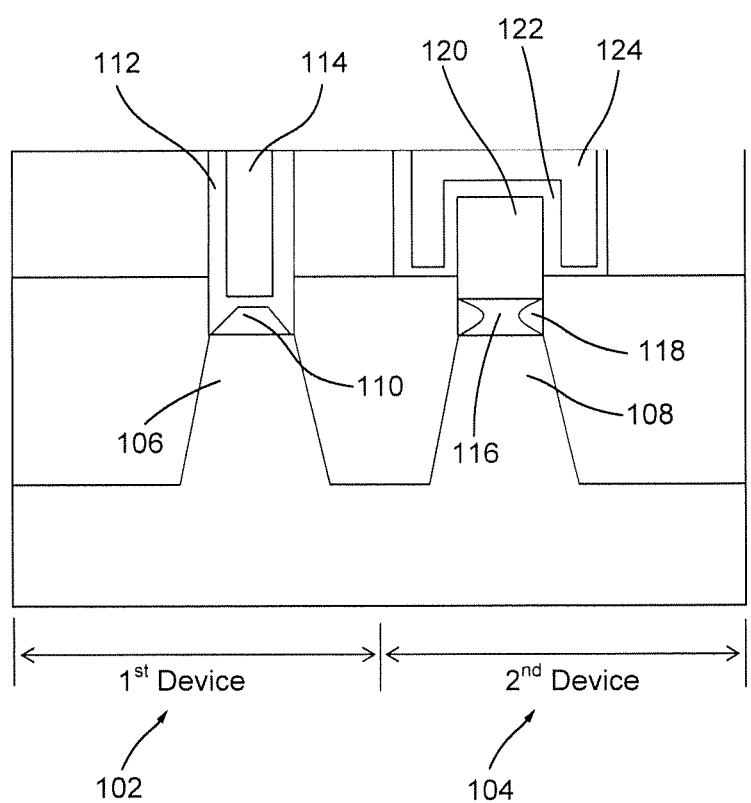
FIG. 1 depicts an example diagram showing multiple devices fabricated on a substrate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multiple FinFETs may be fabricated on a single integrated circuit (IC) chip for different purposes. For example, some FinFETs are used as core devices for performing certain functions, and other FinFETs are used as input/output (I/O) devices for communicating with external circuits. These FinFETs often need different threshold voltages. However, the number of fins on a particular chip is often limited, and thus fabrication of multiple FinFETs with different threshold voltages may be challenging. In addition, other considerations may need to be taken into account for fabrication of these FinFETs. For example, a core device often requires a very thin gate dielectric to achieve a strong capacitive effect for good current control, and may thus suffer leakage currents to the substrate.

FIG. 1 depicts an example diagram showing multiple devices fabricated on a substrate, in accordance with some embodiments. As shown in FIG. 1, a first device 102 and a second device 104 are fabricated on fin structures 106 and 108 respectively. The first device 102 includes a semiconductor material 110 formed on the fin structure 106 and a gate dielectric material 112 formed on the semiconductor material 110 (e.g., on a convex-shaped portion of the semiconductor material 110). Further, the first device 102 includes a gate electrode 114 is formed on the gate dielectric material 112. The second device 104 includes a semiconductor material 116 and a dielectric material 118 formed on the fin structure 108. In addition, the second device 104 includes another semiconductor material 120 formed on the semiconductor material 116 and the dielectric material 118. Further, the second device 104 includes a gate dielectric material 122 and a gate electrode 124 formed on the semiconductor material 120. For example, the dielectric material 118 is formed by partially oxidizing the semiconductor material 116.

In some embodiments, the second device 104 is used as a core device. The dielectric material 118 that surrounds the semiconductor material 116 reduces a transport path of carriers and thus ameliorates the leakage issues associated with the core devices. The first device 102 is associated with a first threshold voltage which is different from a second threshold voltage associated with the second device 104. The first device 102 and the second device 104 each include a FinFET.

Figure 2:
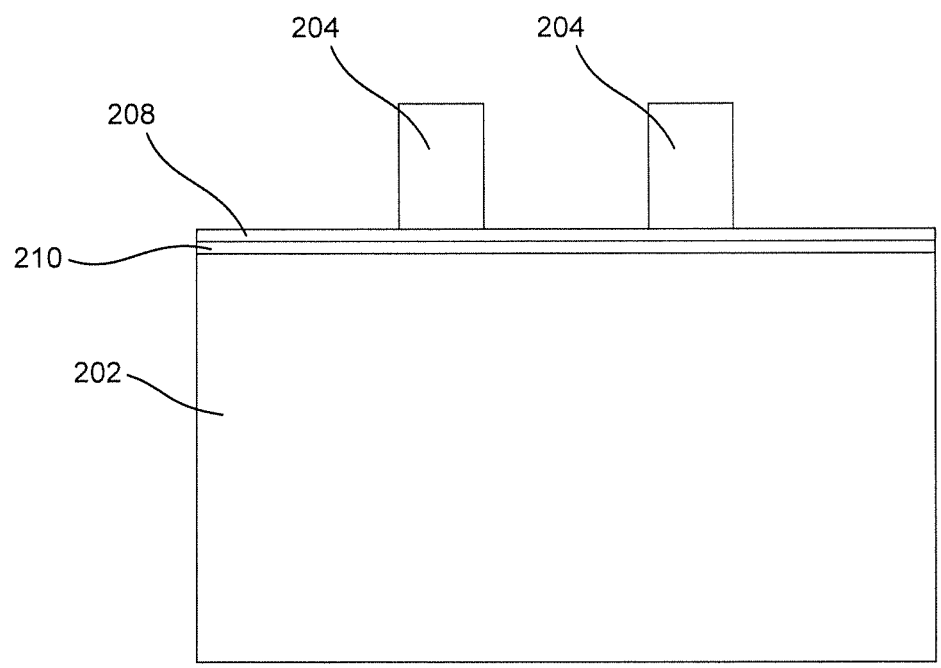
FIGS. 2-13 depict example diagrams showing an example process flow for fabricating multiple devices, in accordance with some embodiments.

FIGS. 2-13 depict example diagrams showing an example process flow for fabricating the devices 102 and 104, in accordance with some embodiments. As shown in FIG. 2, a substrate 202 is selected for fabrication of the devices 102 and 104. A photolithography process is used to define different regions for fabricating the first device 102 and the second device 104. A photo-sensitive layer 204 (e.g., photoresist) is initially formed on top of a hard mark layer 208 (e.g., $Si_3N_4$) which is separated from the substrate 202 by a buffer layer 210 (e.g., $SiO_2$). The photo-sensitive layer 204 is then selectively exposed to light through a mask, and the exposed portion may possess different physical properties than the unexposed portion. Either the exposed portion or the unexposed portion of the photo-sensitive layer 204 is removed by a selected solvent. The portion of the photo-sensitive layer 204 that is not removed is used to protect the structures below.

In some embodiments, the substrate 202 includes silicon, germanium, silicon germanium, III-V materials (e.g., gallium arsenide, silicon carbide, indium arsenide, or indium phosphide), or other suitable materials. For example, the substrate 202 includes an epitaxial layer. In another example, the substrate 202 is strained for performance enhancement. In yet another example, the substrate 202 includes a silicon-on-insulator (SOI) structure.

Figure 3:
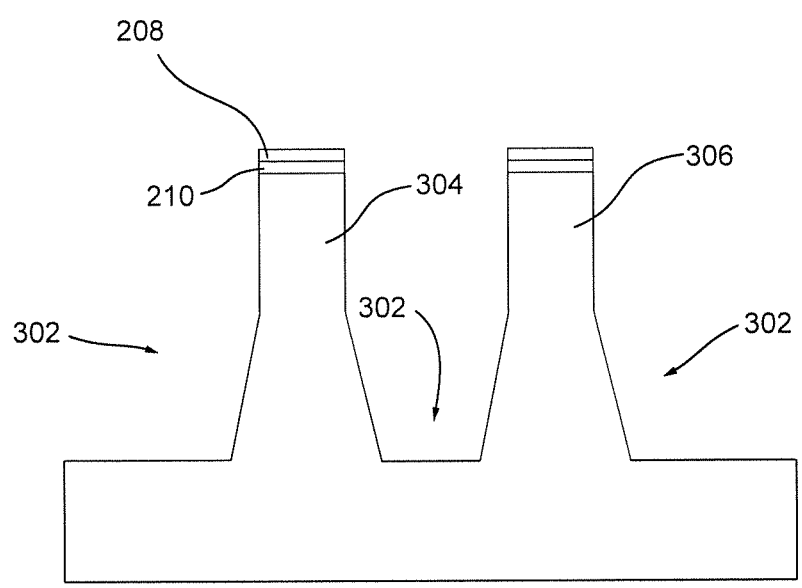

As shown in FIG. 3, one or more recessed regions 302 are formed as a result of etching the substrate 202. For example, the substrate 202 undergoes a wet etching process, where the substrate 202 is immersed in a bath of a selected etchant and parts of the substrate 202 may be removed. In another example, a dry etching process (e.g., plasma etching) is performed on the substrate 202, where energetic free radicals produced by the plasma react at the surface of the substrate 202 to remove parts of the substrate 202. Fin structures 304 and 306 are thus formed, as shown in FIG. 3.

Figure 4:
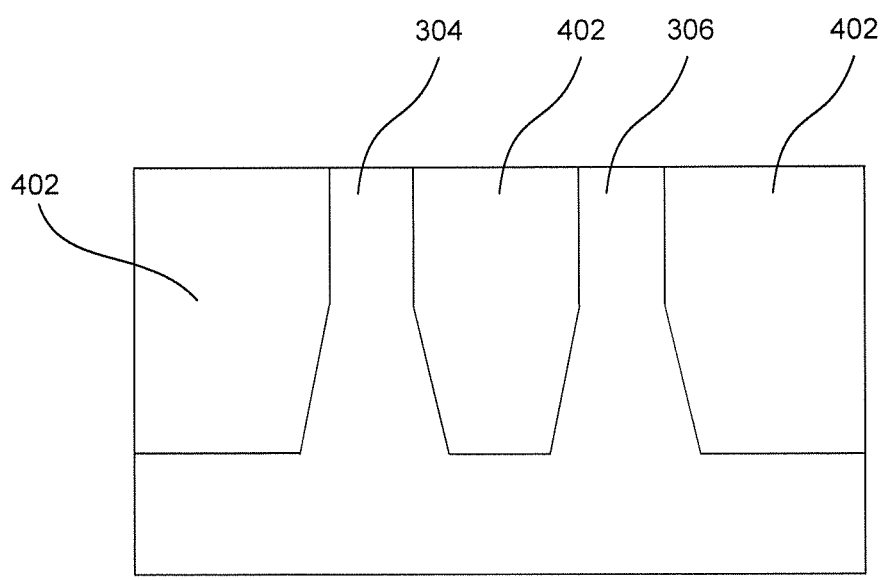

As shown in FIG. 4, a dielectric layer 402 (e.g., $SiO_2$) is formed to fill the recessed regions 302, and a chemical-mechanical polishing/planarization (CMP) process is applied to the dielectric layer 402, and the hard mask layer 208 and the buffer layer 210 are removed after the CMP process to form a structure as shown in FIG. 4. For example, the dielectric layer 402 is formed through physical vapor deposition (PVD), chemical vapor deposition (CVD), atomic layer deposition (ALD), molecular-beam deposition (MBD) or other suitable techniques. As an example, the CMP process uses an abrasive and corrosive chemical slurry (e.g., a colloid) in conjunction with a polishing pad and a retaining ring to make the top surface substantially flat or planar, as shown in FIG. 4.

Figure 5:
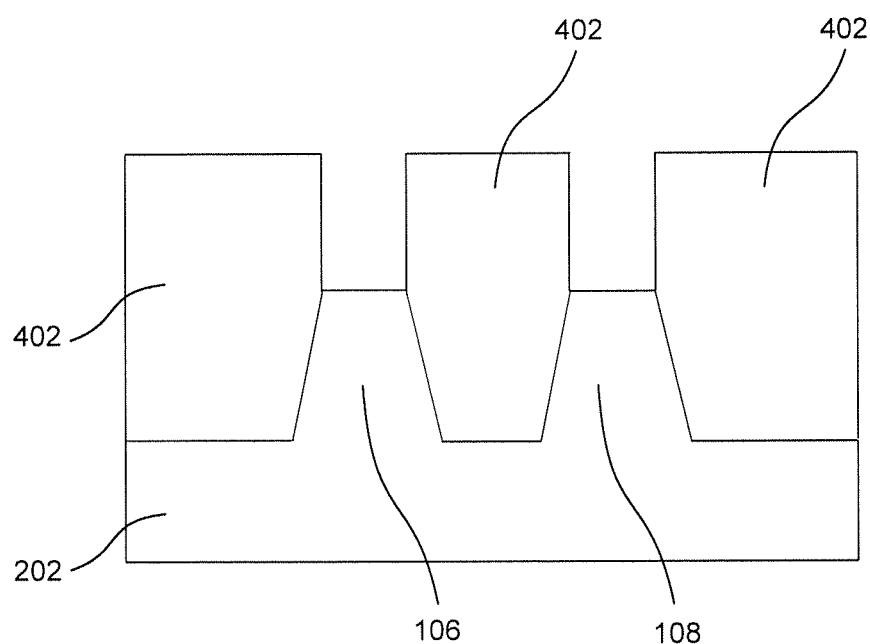
Figure 6:
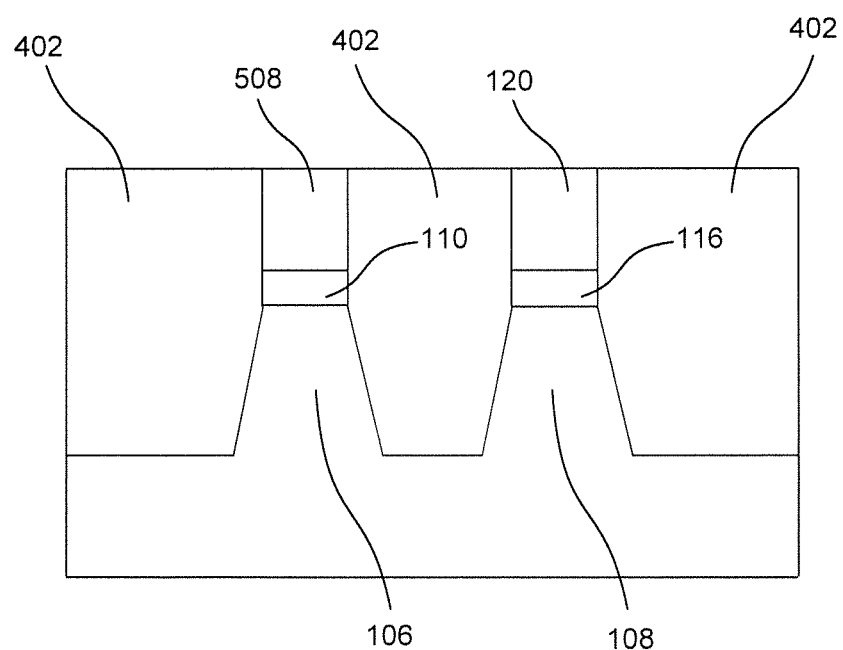

Top portions of the fin structures 304 and 306 are removed (e.g., through wet etching or dry etching) to form the first fin structure 106 and the second fin structure 108, respectively, as shown in FIG. 5. Then, the semiconductor materials 110 and 508 are formed (e.g., sequentially) on the fin structure 106, and the semiconductor materials 116 and 120 are formed (e.g., sequentially) on the fin structure 108, as shown in FIG. 6. For example, the semiconductor materials 110, 508, 116 and 120 are formed through selectively grown by a low-pressure chemical vapor deposition (LPCVD) process or other suitable techniques. In some embodiments, the semiconductor material 110 includes a same material as the semiconductor material 116, and the semiconductor material 508 includes a same material as the semiconductor material 120. For example, the semiconductor material 110 and the semiconductor material 116 include silicon, germanium, silicon germanium, III-V materials, or other suitable materials. In another example, the semiconductor material 508 and the semiconductor material 120 include silicon, germanium, silicon germanium, III-V materials, or other suitable materials.

Figure 7:
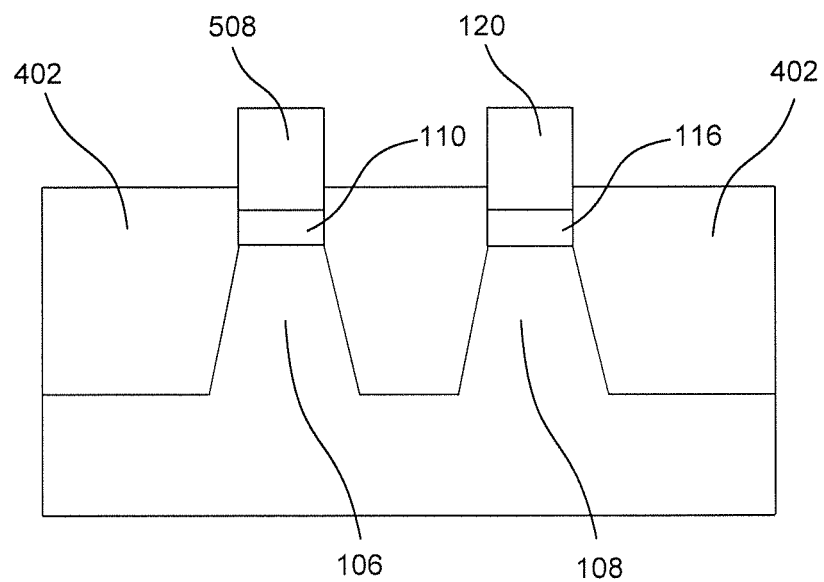
Figure 8:
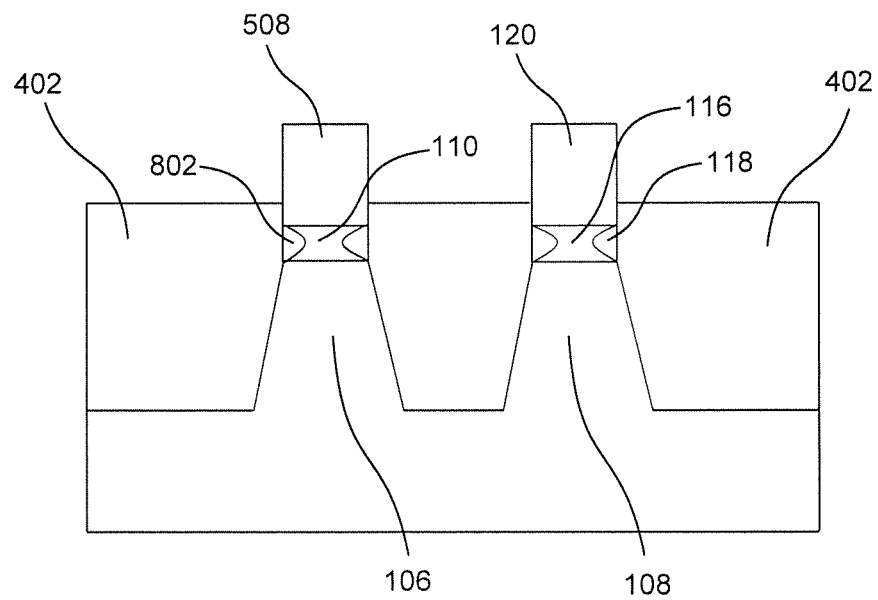

As shown in FIG. 7, the dielectric layer 402 is partially removed (e.g., through wet etching or dry etching). Then, an oxidization process is performed. A dielectric material 802 is formed by partially oxidizing the semiconductor material 110, and the dielectric material 118 is formed by partially oxidizing the semiconductor material 116, as shown in FIG. 8. For example, the oxidization rate of the semiconductor material 508 is much smaller than that of the semiconductor material 110. Further, the oxidization rate of the semiconductor material 120 is much smaller than that of the semiconductor material 116. As an example, the dielectric material 802 and/or the dielectric material 118 include germanium oxide, silicon germanium oxide, or other oxides. In some embodiments, the semiconductor material 110 and the semiconductor material 116 are oxidized from a side portion to a middle portion respectively.

Figure 9:
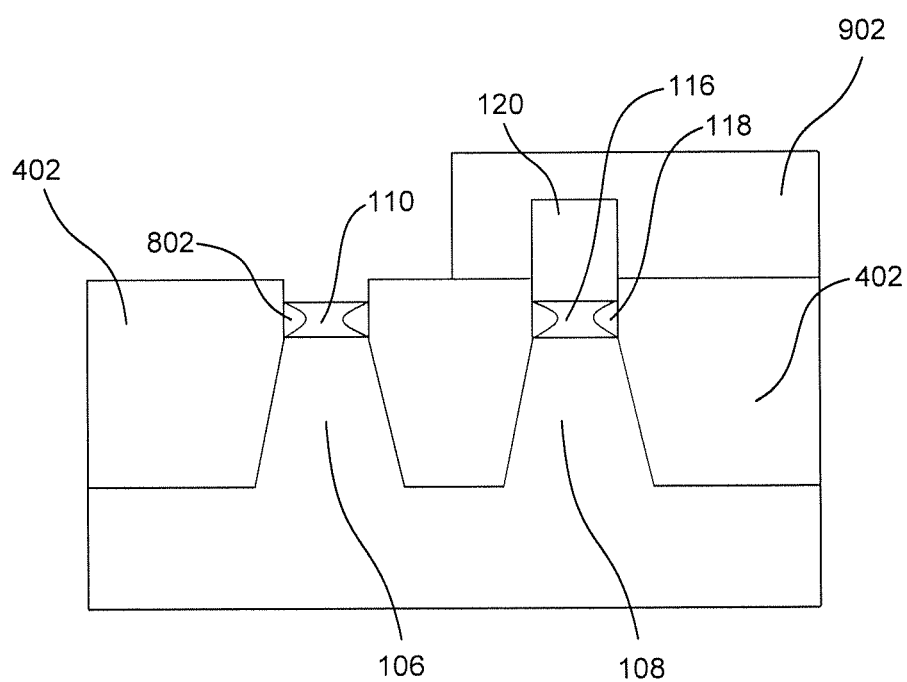

Then, a photo-sensitive layer (e.g., photoresist) is formed on top of the entire wafer and is selectively exposed to light through a mask. Part of the photo-sensitive layer is removed by a solvent to expose the semiconductor material 508 that is subsequently removed (e.g., through wet etching or dry etching). As shown in FIG. 9, the remaining photo-sensitive layer 902 covers the semiconductor material 120 and part of the dielectric layer 402, while the semiconductor material 110 is exposed.

Figure 10:
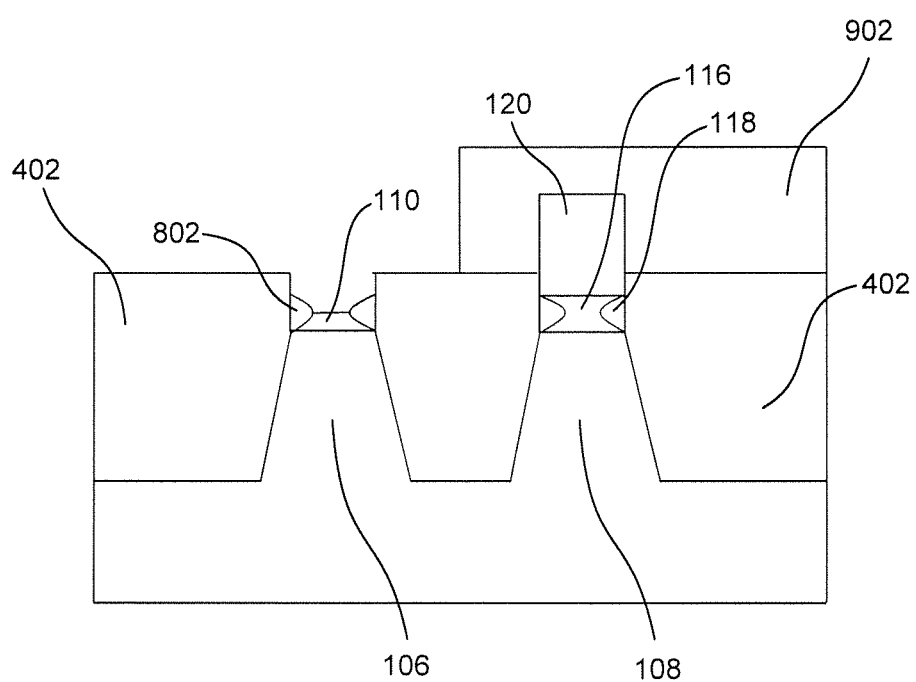
Figure 11:
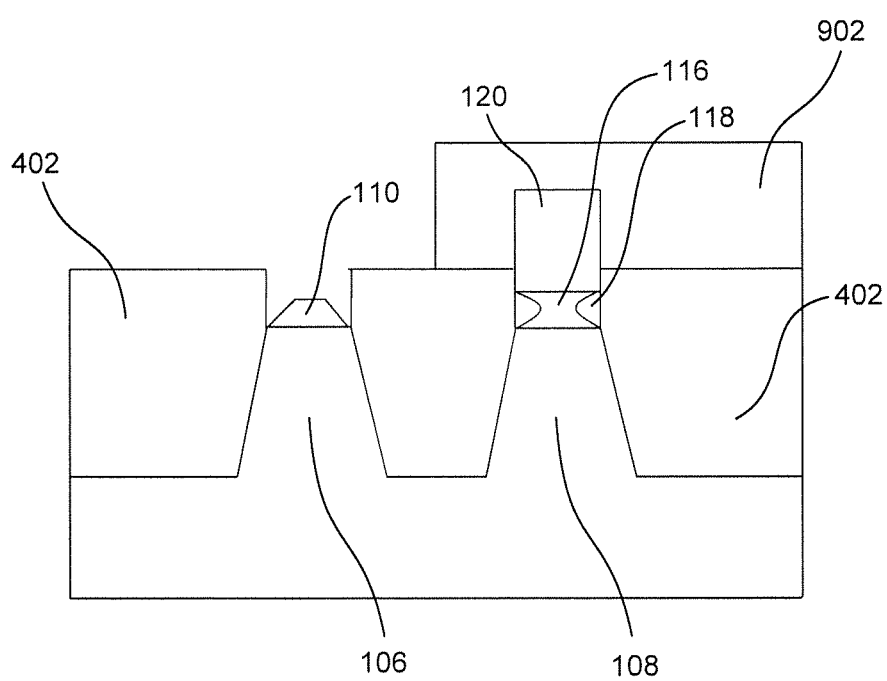

Part of the semiconductor 110 is removed (e.g., through wet etching or dry etching), as shown in FIG. 10. Further, the dielectric material 802 is removed (e.g., through wet etching or dry etching), as shown in FIG. 11. For example, the remaining semiconductor 110 includes a convex-shaped portion. Then, the photo-sensitive layer 902 is removed by a solvent.

Figure 12:
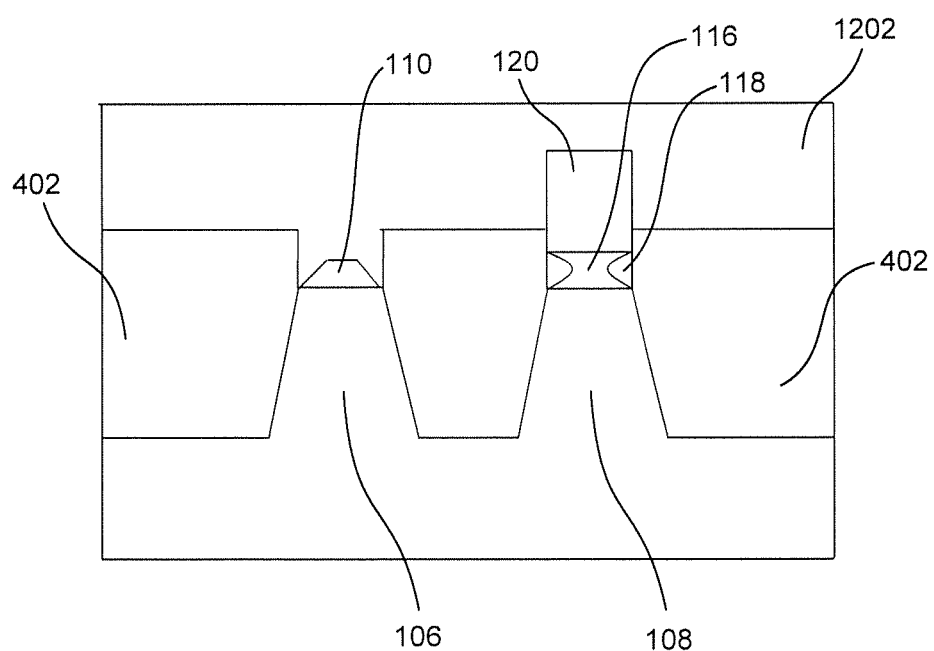

An inter-layer dielectric (ILD) material 1202 (e.g., $SiO_2$, PSG) is formed on the entire wafer and a CMP process is performed on the ILD material 1202, as shown in FIG. 12. For example, the ILD material 1202 is used to electrically separate closely spaced interconnect lines arranged in one or more levels in a later metallization process. The ILD material 1202 is patterned (e.g., through a photolithography process) and one or more openings are formed in the ILD material 1202.

Figure 13:
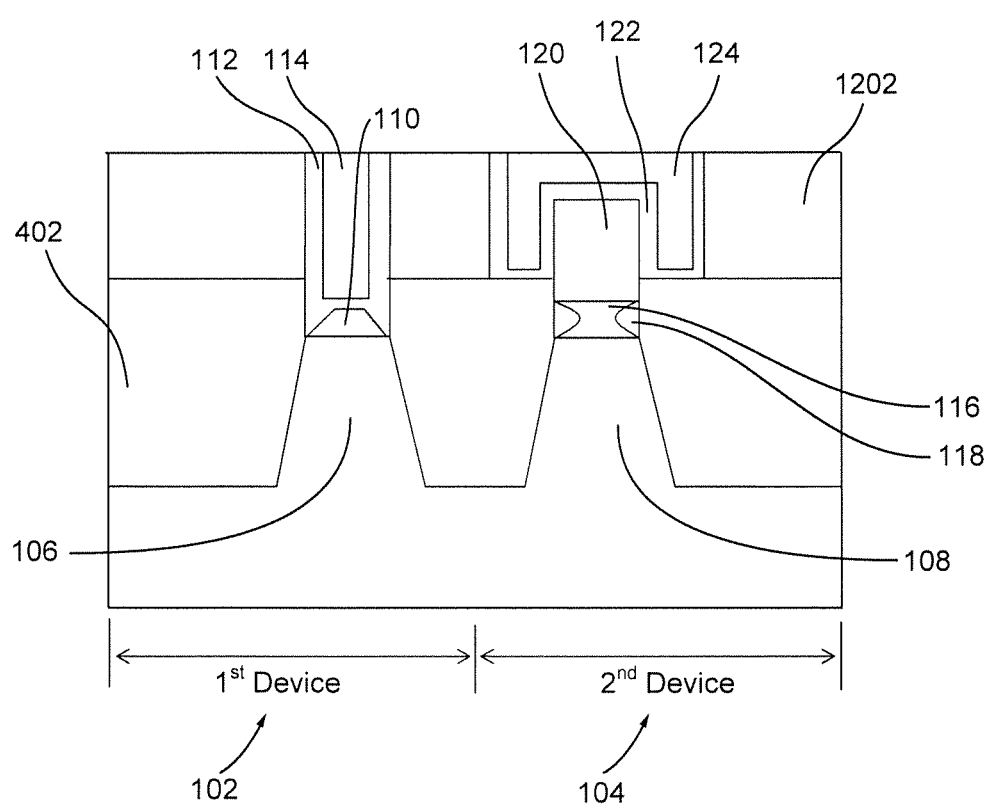

The gate dielectric material 112 and the gate electrode 114 are formed on the semiconductor material 110 (e.g., on the convex-shaped portion of the semiconductor material 110), and the gate dielectric material 122 and the gate electrode 124 are formed (e.g., sequentially) on the semiconductor material 120, as shown in FIG. 13. For example, the gate dielectric material 112 and/or the gate dielectric material 122 include silicon nitride, a high-k material, or other suitable materials. The gate electrode 114 and/or the gate electrode 124 include aluminum, titanium, tantalum, titanium nitride, tantalum nitride, titanium aluminum, or other suitable materials.

Figure 14:
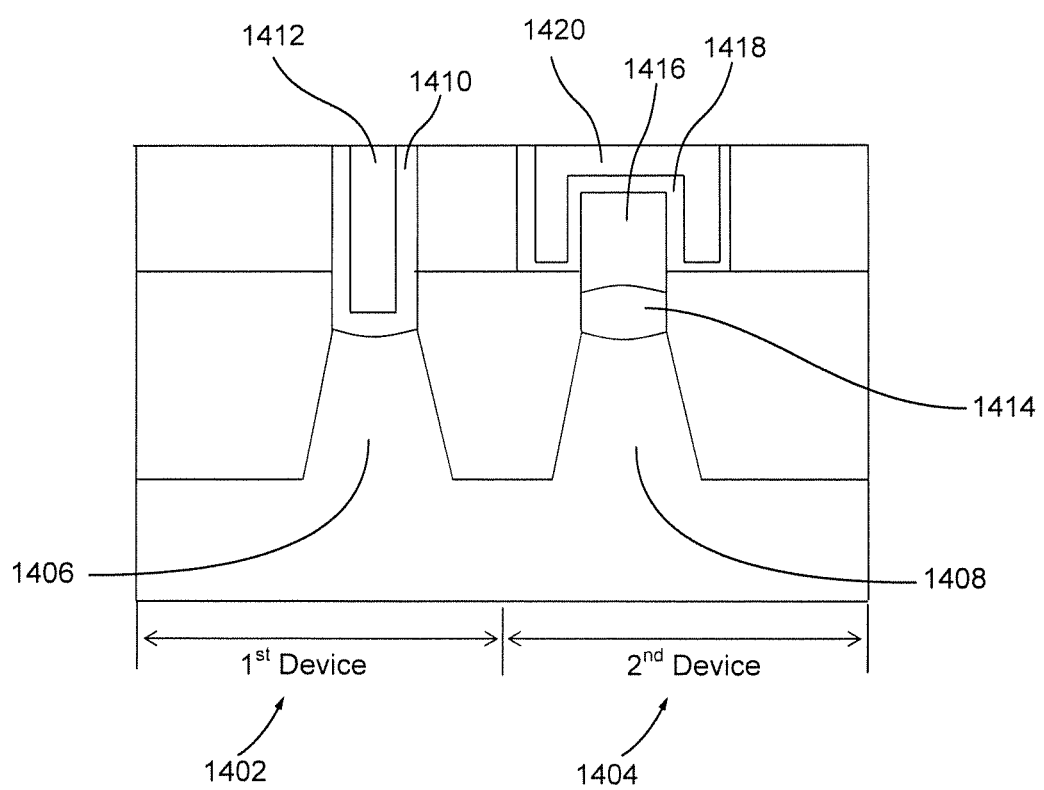
FIG. 14 depicts another example diagram showing multiple devices fabricated on a substrate, in accordance with some embodiments.

FIG. 14 depicts another example diagram showing multiple devices fabricated on a substrate, in accordance with some embodiments. As shown in FIG. 14, a first device 1402 and a second device 1404 are fabricated on fin structures 1406 and 1408 respectively. The first device 1402 includes a gate dielectric material 1410 formed on the fin structure 1406 (e.g., on a concave-shaped portion of the fin structure 1406), and a gate electrode 1412 formed on the gate dielectric material 1410. The second device 1404 includes a dielectric material 1414 formed on the fin structure 1408, and a semiconductor material 1416 formed on the dielectric material 1414. Further, the second device 1404 includes a gate dielectric material 1418 and a gate electrode 1420 formed on the semiconductor material 1416. For example, the dielectric material 1414 is formed by fully oxidizing another semiconductor material.

In some embodiments, the second device 1404 is used as a core device. The dielectric material 1414 reduces a transport path of carriers and thus ameliorates the leakage issues associated with the core devices. The first device 1402 is associated with a first threshold voltage which is different from a second threshold voltage associated with the second device 1404. The first device 1402 and the second device 1404 each include a FinFET.

Figure 15:
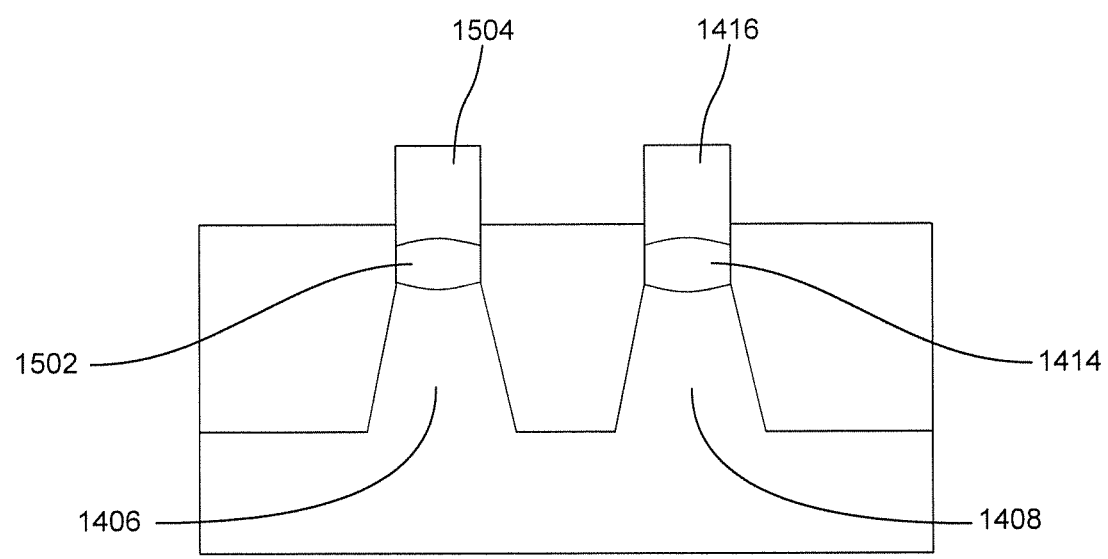
FIGS. 15-19 depict example diagrams showing another example process flow for fabricating multiple devices, in accordance with some embodiments.

FIGS. 15-19 depict example diagrams showing an example process flow for fabricating the devices 1402 and 1404, in accordance with some embodiments. The process flow for fabricating the device 1402 and 1404 includes operations similar to what are shown in FIGS. 2-7. Two layers of semiconductor materials including a semiconductor material 1504 (e.g., the semiconductor material 508 as shown in FIG. 7) are formed on the fin structure 1406. Instead of being partially oxidized (e.g., as shown in FIG. 8), the semiconductor material (e.g., the semiconductor material 110 as shown in FIG. 7) formed between the semiconductor material 1504 and the fin structure 1406 is fully oxidized to form a dielectric material 1502, as shown in FIG. 15. Two layers of semiconductor materials including the semiconductor material 1416 (e.g., the semiconductor material 120 as shown in FIG. 7) are formed on the fin structure 1408, and the semiconductor material (e.g., the semiconductor material 116 as shown in FIG. 7) formed between the semiconductor material 1416 and the fin structure 1408 is fully oxidized to form the dielectric material 1414, as shown in FIG. 15. As an example, the dielectric material 1502 and/or the dielectric material 1414 include germanium oxide, silicon germanium oxide, or other oxides.

Figure 16:
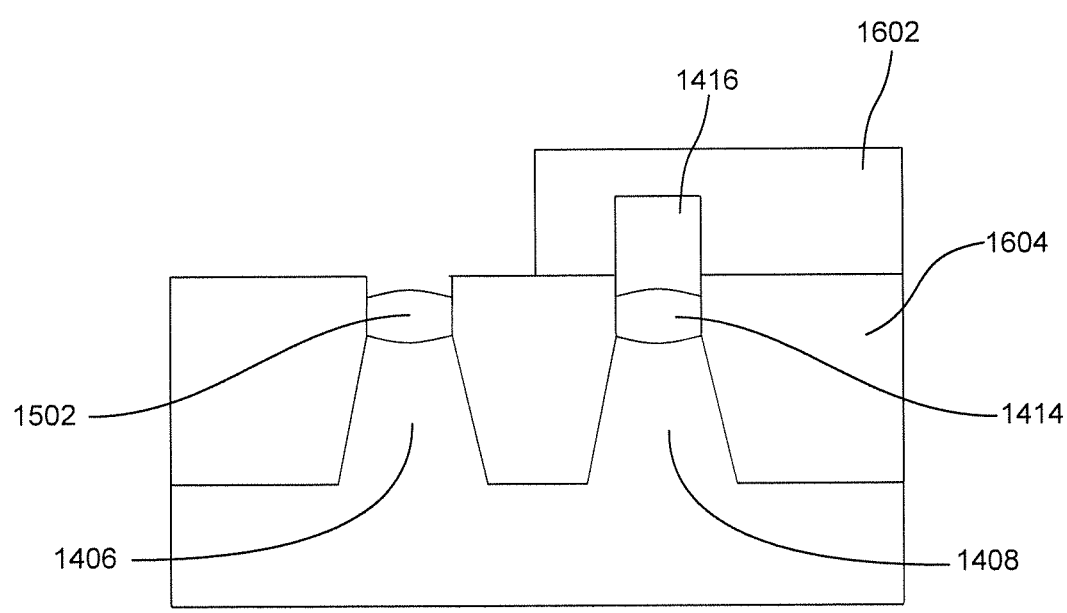

Then, a photo-sensitive layer (e.g., photoresist) is formed on top of the entire wafer and is selectively exposed to light through a mask. Part of the photo-sensitive layer is removed by a solvent to expose the semiconductor material 1504 that is subsequently removed (e.g., through wet etching or dry etching). As shown in FIG. 16, the remaining photo-sensitive layer 1602 covers the semiconductor material 1416 and part of a dielectric layer 1604 (e.g., the dielectric layer 402 as shown in FIG. 7) between the fin structures 1406 and 1408, while the dielectric material 1502 is exposed.

Figure 17:
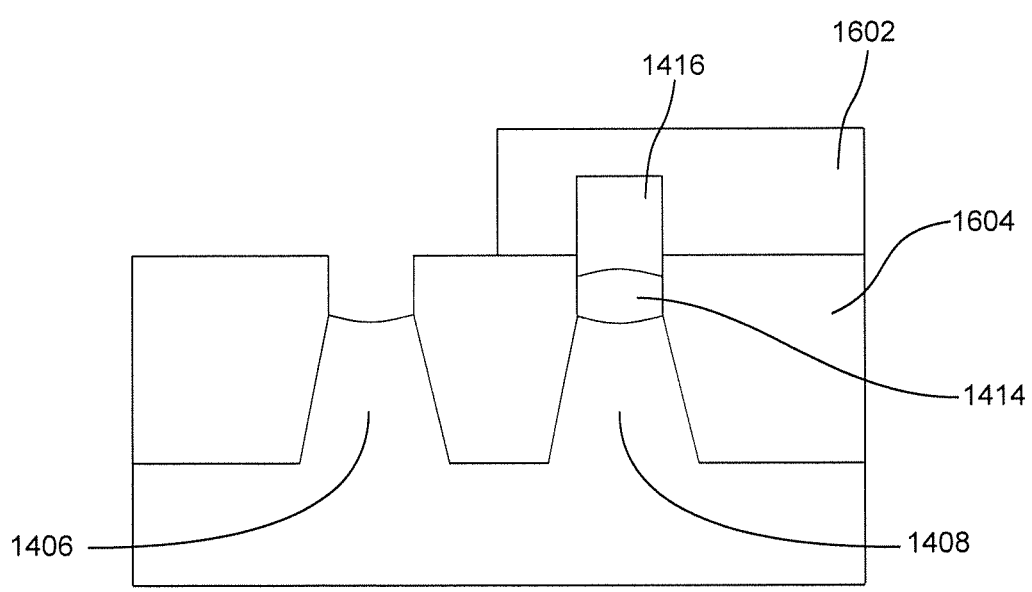

Then, the dielectric material 1502 is removed (e.g., through wet etching or dry etching), as shown in FIG. 17. For example, the fin structure 1406 includes a concave-shaped portion. Then, the photo-sensitive layer 1602 is removed by a solvent.

Figure 18:
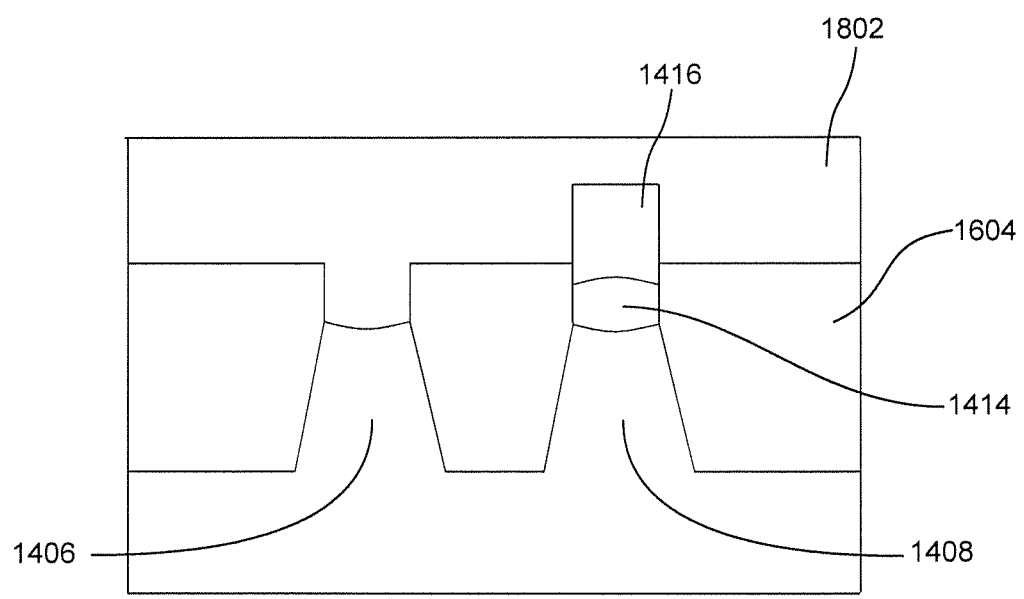

An inter-layer dielectric (ILD) material 1802 (e.g., $SiO_2$, PSG) is formed on the entire wafer and a CMP process is performed on the ILD material 1802, as shown in FIG. 18. The ILD material 1802 is then patterned (e.g., through a photolithography process) and one or more openings are formed in the ILD material 1802.

Figure 19:
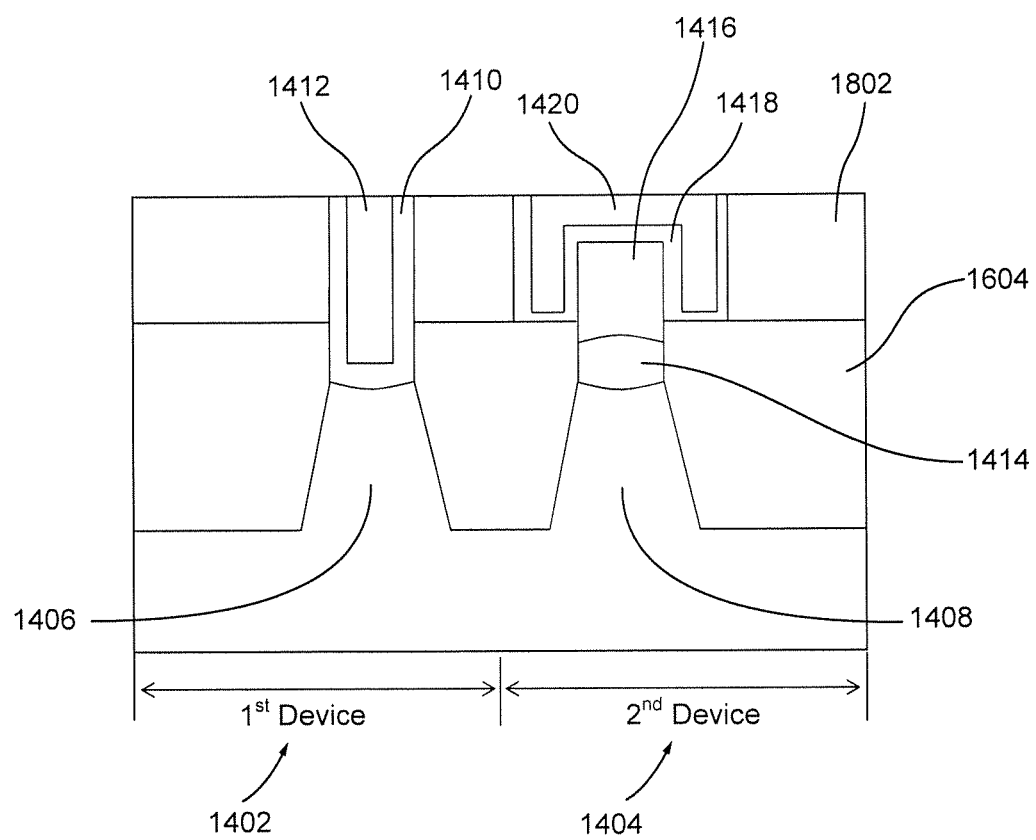

The gate dielectric material 1410 and the gate electrode 1412 are formed on the fin structure 1406 (e.g., on the concave-shaped portion of the fin structure 1406), and the gate dielectric material 1418 and the gate electrode 1420 are formed on the semiconductor material 1416, as shown in FIG. 19. For example, the gate dielectric material 1410 and/or the gate dielectric material 1418 include silicon nitride, a high-k material, or other suitable materials. The gate electrode 1412 and/or the gate electrode 1420 include aluminum, titanium, tantalum, titanium nitride, tantalum nitride, titanium aluminum, or other suitable materials.

Figure 20:
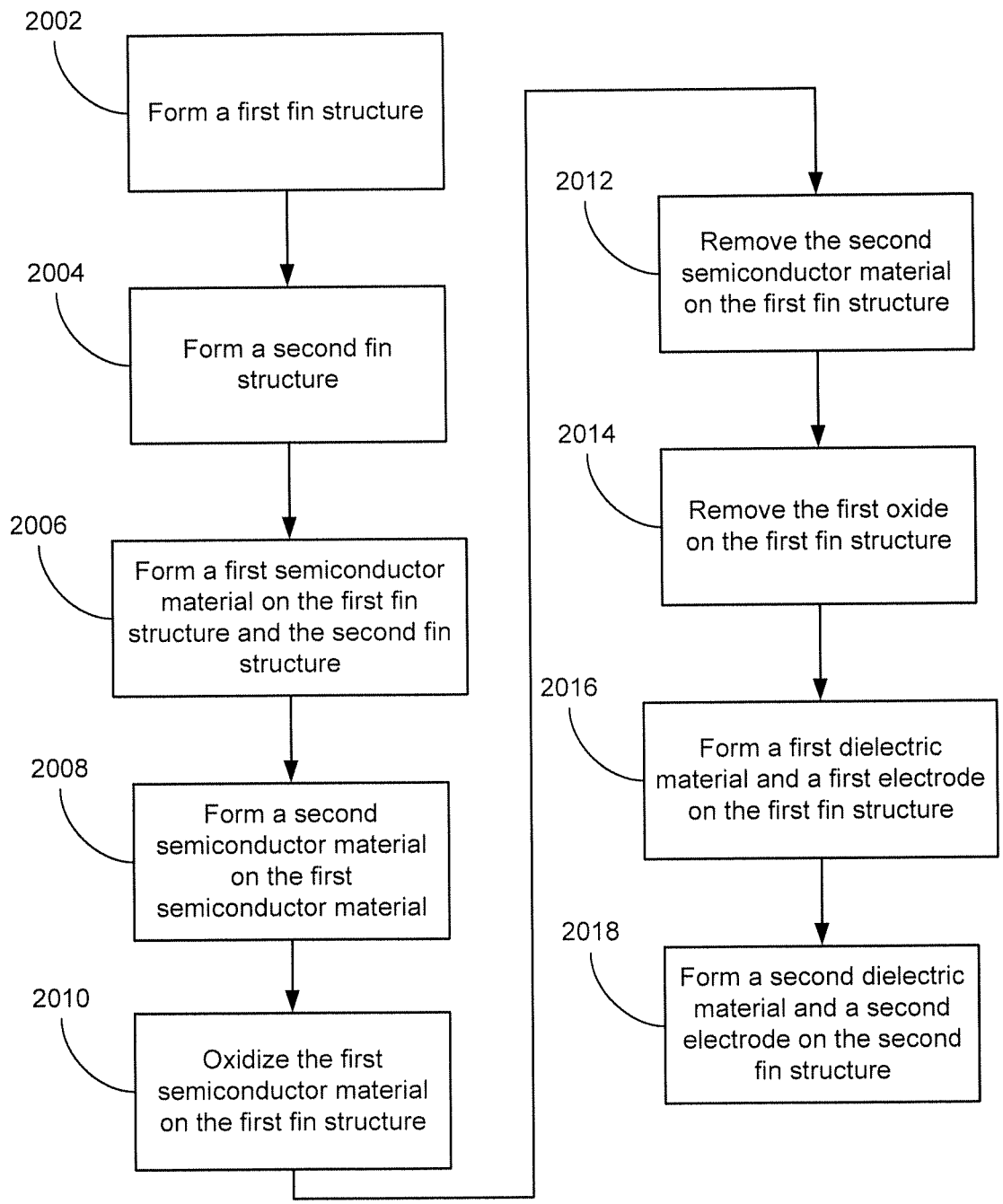
FIG. 20 depicts an example flow chart for fabricating multiple devices on a substrate, in accordance with some embodiments.

FIG. 20 depicts an example flow chart for fabricating multiple devices on a substrate, in accordance with some embodiments. At 2002, a first fin structure is formed on a substrate. At 2004, a second fin structure is formed on the substrate. For example, the first fin structure and the second fin structure are formed simultaneously or sequentially. At 2006, a first semiconductor material is formed on both the first fin structure and the second fin structure. At 2008, a second semiconductor material is formed on the first semiconductor material on both the first fin structure and the second fin structure. At 2010, the first semiconductor material on the first fin structure is oxidized to form a first oxide. At 2012, the second semiconductor material on the first fin structure is removed. At 2014, the first oxide on the first fin structure is removed (e.g., optionally). At 2016, a first dielectric material and a first electrode are formed on the first fin structure. For example, the first dielectric material and the first electrode are formed sequentially. At 2018, a second dielectric material and a second electrode are formed on the second fin structure. For example, the second dielectric material and the second electrode are formed sequentially.

According to one embodiment, a method is provided for fabricating semiconductor device structures on a substrate. A first fin structure is formed on a substrate. A second fin structure is formed on the substrate. A first semiconductor material is formed on both the first fin structure and the second fin structure. A second semiconductor material is formed on the first semiconductor material on both the first fin structure and the second fin structure. The first semiconductor material on the first fin structure is oxidized to form a first oxide. The second semiconductor material on the first fin structure is removed. The first oxide on the first fin structure is removed. A first dielectric material and a first electrode are formed on the first fin structure. A second dielectric material and a second electrode are formed on the second fin structure.

According to another embodiment, an article includes a first device and a second device. The first device includes: a first fin structure on a substrate, a first semiconductor material on the first fin structure, a first dielectric material on the first semiconductor material, and a first electrode on the first dielectric material. The second device includes: a second fin structure on the substrate, a second dielectric material and the first semiconductor material on the second fin structure, a second semiconductor material on the second dielectric material and the first semiconductor material, a third dielectric material on the second semiconductor material, and a second electrode on the third dielectric material. The second dielectric material corresponds to an oxide of the first semiconductor material.

According to yet another embodiment, an article includes a first device and a second device. The first device includes: a first fin structure on a substrate, a first dielectric material on the first fin structure, and a first electrode on the first dielectric material. The second device includes: a second fin structure on the substrate, a second dielectric material on the second fin structure, a first semiconductor material on the second dielectric material, a third dielectric material on the first semiconductor material, and a second electrode on the third dielectric material. The second dielectric material corresponds to an oxide of a second semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first device including a first fin structure on a substrate, a first semiconductor layer made of a first semiconductor material and disposed on the first fin structure, a first gate dielectric layer on the first semiconductor layer, and a first gate electrode on the first gate dielectric layer; and
a second device including a second fin structure on the substrate, a second semiconductor layer made of the first semiconductor material and disposed on the second fin structure, a third semiconductor layer on the second semiconductor layer, a second gate dielectric layer on the third semiconductor layer, and a second gate electrode on the second gate dielectric layer,
wherein an oxide of the first semiconductor material is formed on side portions of the second semiconductor layer, and
the oxide is separated from the second gate dielectric layer.

2. The semiconductor device of claim 1, wherein:
the first semiconductor layer has a convex-shaped portion, and
the first gate dielectric layer is formed on the convex-shaped portion of the first semiconductor layer.

3. The semiconductor device of claim 1, wherein the oxide surrounds the second semiconductor layer.

4. The semiconductor device of claim 1, further comprising an isolation dielectric layer in which the first and second fin structures are embedded,
wherein an upper surface of the first semiconductor layer and an upper surface of the second semiconductor layer are located below an upper surface of the isolation dielectric layer.

5. The semiconductor device of claim 4, wherein:
the second gate dielectric layer is disposed on the upper surface of the isolation dielectric layer, and
a top of the oxide is located below a bottom of the gate dielectric layer.

6. The semiconductor device of claim 4, wherein a bottom of the first gate electrode is located below the upper surface of the isolation dielectric layer.

7. The semiconductor device of claim 1, wherein the first semiconductor material contains at least germanium.

8. The semiconductor device of claim 7, wherein the oxide is germanium oxide or silicon germanium oxide.

9. A semiconductor device comprising:
a first fin structure on a substrate;
an isolation dielectric layer in which the first fin structure is embedded;
a first semiconductor layer made of a first semiconductor material and disposed on the first fin structure;
a first gate dielectric layer on the first semiconductor layer and continuously covering an uppermost surface and side surfaces of the first semiconductor layer;
a first gate electrode on the first gate dielectric layer; and
an interlayer dielectric layer on the isolation dielectric layer,
wherein an entirety of the first semiconductor layer is located below an interface between the isolation dielectric layer and the interlayer dielectric layer,
a width of the uppermost surface of the first semiconductor layer is smaller than a width of a bottom surface of the first semiconductor layer, and
a part of the first gate dielectric layer is penetrates into the isolation dielectric layer.

10. The semiconductor device of claim 9, wherein a bottom of the first gate dielectric layer is located below the interface.

11. The semiconductor device of claim 9, wherein a bottom of the first gate electrode is located below the interface.

12. The semiconductor device of claim 9, wherein:
the first semiconductor layer has a convex-shaped portion, and
the first gate dielectric layer is formed on the convex-shaped portion of the first semiconductor layer.

13. A semiconductor device comprising:
a fin structure on a substrate;
a first semiconductor layer made of a first semiconductor material and disposed on the fin structure;
a second semiconductor layer made of a second semiconductor material and disposed on the first semiconductor layer;
a gate dielectric layer on the second semiconductor layer; and
a gate electrode on the gate dielectric layer,
wherein an oxide of the first semiconductor material is formed on side portions of the first semiconductor layer, and
the oxide is separated from the gate dielectric layer.

14. The semiconductor device of claim 13, wherein the oxide surrounds the first semiconductor layer.

15. The semiconductor device of claim 13, further comprising an isolation dielectric layer in which the fin structure is embedded,
wherein an upper surface of the first semiconductor layer is located below an upper surface of the isolation dielectric layer.

16. The semiconductor device of claim 15, wherein the gate dielectric layer is disposed on the upper surface of the isolation dielectric layer.

17. The semiconductor device of claim 13, wherein the first semiconductor material contains at least germanium.

18. The semiconductor device of claim 17, wherein the oxide is germanium oxide or silicon germanium oxide.

19. The semiconductor device of claim 13, wherein the second semiconductor layer protrudes from the isolation dielectric layer.

20. The semiconductor device of claim 13, wherein the oxide has a largest thickness at a center portion in a vertical direction.

* * * * *